Jan. 19, 1971 J. S. STROBEL 3,556,899

TACK BONDING OF COVERLAY

Filed Oct. 9, 1967

INVENTOR.
JOHN S. STROBEL

BY

Orrin M. Haugen

ATTORNEY

United States Patent Office 3,556,899
Patented Jan. 19, 1971

3,556,899
TACK BONDING OF COVERLAY

John S. Strobel, Northfield, Minn., assignor to G. T. Schjeldahl Company, Northfield, Minn., a corporation of Minnesota Filed Oct. 9, 1967, Ser. No. 673,692
Int. Cl. B32b 31/10
U.S. Cl. 156—553 5 Claims

ABSTRACT OF THE DISCLOSURE

An apparatus and technique for encapsulating a printed wiring array wherein the conductors are disposed upon the exposed surface of a flexible substrate, the encapsulating coverlay being a flexible coverlay or covering film having a surface arranged to establish a bond with the exposed surface and conductors. The apparatus and technique includes a means for establishing a nip zone between first and second pressure members, such as rollers, and further includes means for delivering a printed wiring which is mounted on a substrate and a flexible coverlay film for the mounted wiring into the nip zone simultaneously. In addition, at least one of the pressure members is provided with a raised reticulate pattern (of substantially continuous configuration) having intersecting longitudinal and transverse recessed segments so as to form a plurality of substantially isolated and closed tack bonded zones existing between the exposed surface and the bonding surface. The tack bonded material may thereafter be firmly bonded together over the entire area of contact.

The present invention relates generally to an apparatus and technique for encapsulating an array of printed wiring between a pair of flexible substrate members or films, including a flexible substrate film and a flexible coverlay film. More specifically, the invention relates to an improved apparatus and technique for encapsulating mounted flexible printed circuitry with a flexible coverlay film, wherein registration between the mounted circuitry and the film forming the coverlay is accurate, precise, and carefully controlled from one circuitry array to another. The concept of the present invention is particularly adapted for use in connection with the substantially complete encapsulation of mounted flexible printed wiring on a roll-to-roll basis.

In the production of flexible printed wiring, it is frequently desirable to provide a facility for performing the various operations which are required to prepare the circuitry so that these operations may be carried out on a roll-to-roll basis. Unfortunately, any error in registration is these systems will generally occur on a cumulative basis, thus rendering it difficult to prepare such materials when accurate registration is required between the individual members forming or comprising the ultimate finished or laminated structure. Accordingly, various techniques have been employed to form the individual members of the laminate structure in order to provide precise registration between individual members of the laminate being prepared.

In accordance with the present invention, an improved technique is provided wherein precise registration can be achieved between the members of the laminate structure, the invention utilizing a technique for forming an initial bond across a substantially regular, generally reticulate pattern of isolated zones covering a portion of the surface of the structure, the completed over-all bond being prepared as a subsequent separate operation. The initial or tack bond provides for a minimum of distortion to occur between the surfaces being bonded inasmuch as only a modest portion of the over-all area is being subjected to the bonding operation, thus better enabling the physical properties of the individual substrates to be controlled and thereby limit any distortion which may occur between the individual members forming the laminate structure such as by shrinkage or otherwise.

It has been found that the regular pattern formed in printed circuitry by this technique provides, upon forming the finished product, that the material presented in the final bonding technique gives a regular and alternating thicker-thinner material flow. This enables the preparation of finished material having enhanced peel strength, which is believed due to the arrangement of the surfaces and the sealing areas, which arrangement appears to produce better legging in the finished product.

It has been further found that the flowing of the adhesive between the individual surfaces is enhanced, and the wetting is rendered superior. There is significantly less air entrapment, and no large voids are formed. This reticulate compression operation provides more material to be available to permit shrinkage to occur in the system in controlled fashion. This controlled shrinkage is therefore modified in its effect on the mass of the individual zones or areas, and its effect upon the finished product is not detrimental. Adhesive material, to establish the bond between the coverlay film and the mounted circuitry, may be provided either as a solvent-dispersed adhesive in the system, or as a thermally activated adhesive applied to the bonding surface of the coverlay film. Suitable adhesives are commercially available, and generally comprise, for example, a mixture of ethyl sebacate and ethyl terephthalate on a 60:40 mol percent basis. Of course, other systems may be utilized, as deemed appropriate for the materials being treated.

Therefore, it is an object of the present invention to provide an improved technique for the encapsulation of printed wiring, preferably the encapsulation of flexible printed wiring.

It is yet a further object of the present invention to provide an improved technique for the encapsulation of mounted flexible printed wiring which includes the utilization of a tack bonding operation along a substantially regular and reticulate pattern, the tack bonding occurring across a limited portion or segment of the entire area being encapsulated.

It is yet a further object of the present invention to provide an improved technique for the roll-to-roll encapsulation of mounted flexible printed wiring wherein the encapsulation operation encompasses a tack bonding of the surface of the coverlay to the surface of the printed wiring, this tack bonding occurring across a regular reticulate pattern.

Other and further objects of the present invention will become apparent to those skilled in the art upon a study of the following specification, appended claims, and accompanying drawing wherein:

Figures 1, 2:
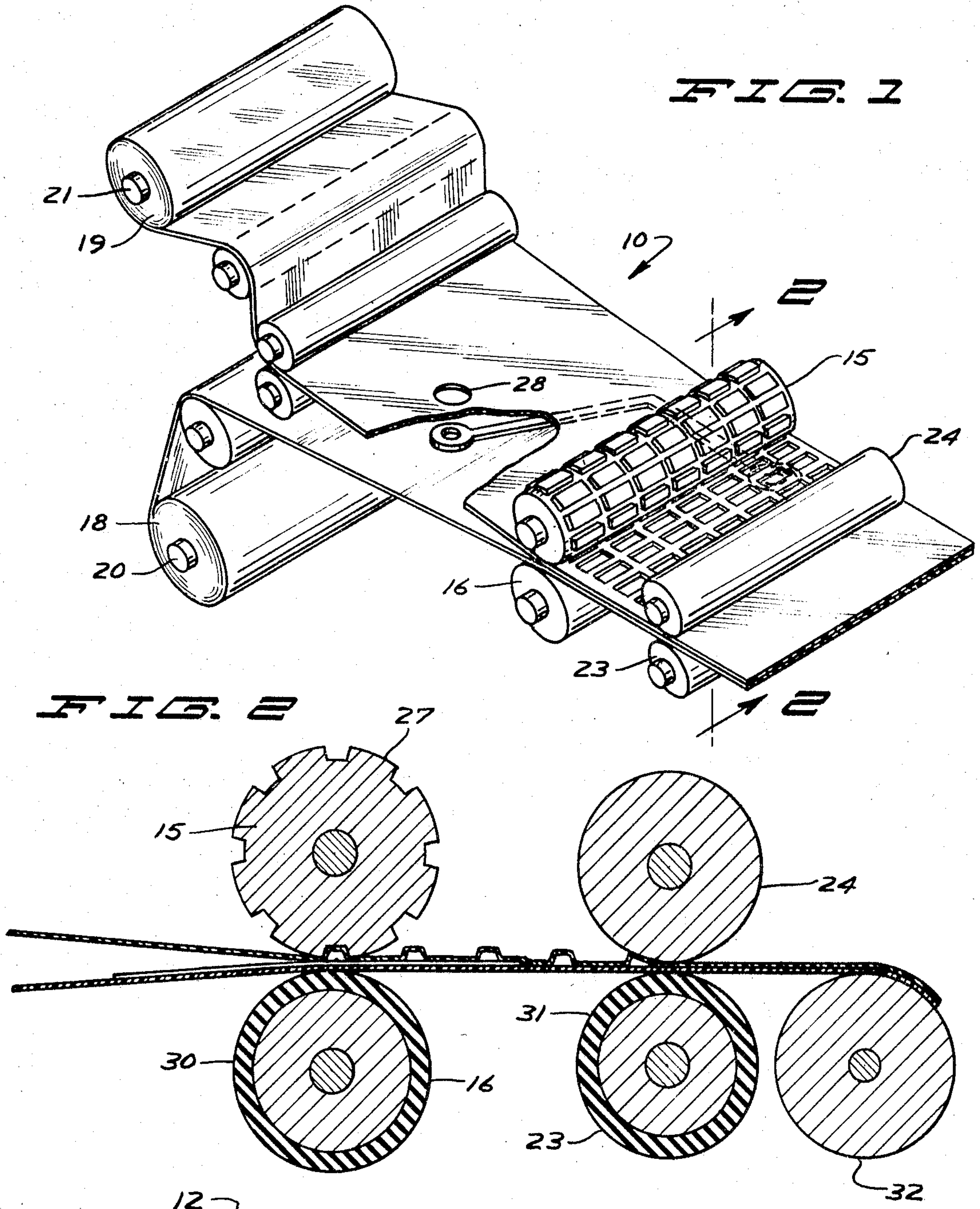
FIG. 1 is a perspective view of a tack bonding station in a coverlay application operation, the system shown being one which functions on a roll-to-roll basis.
FIG. 2 is a vertical sectional view taken along the line and in the direction of the arrows 2—2 of FIG. 1.
Figure 3:
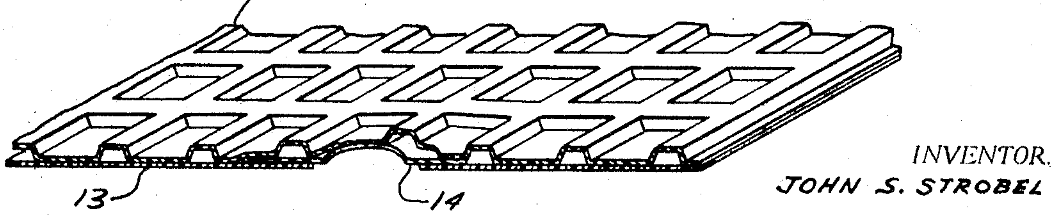
FIG. 3 is a perspective view of a portion of the partially completed product formed in the coverlay tack bonding operation.

In the preferred modification of the present invention, and with particular reference being directed to FIGS. 1 and 2 of the drawing, the encapsulating apparatus which is shown generally at 10 in these figures is arranged to treat mounted printed wiring such as is illustrated at 12 in FIG. 3, for example. The mounted printed wiring includes a flexible substrate member 13 along with conductors 14—14 disposed in appropriate relative disposition along the surface thereof. The encapsulating apparatus 10 includes a pair of tack sealing roll members 15 and 16, these rollers being adapted to receive the individual films of sheet material wound from and delivered from the supply rolls 18 and 19. Individual journals, such as the journals 20 and 21 are provided for the material rolls or supply rolls 18 and 19 respectively. Suitable takeup rolls; not shown, are also provided for the system, the system thereby being arranged to operate on a roll-to-roll basis. Of course, the system may operate on an intermittant or step basis as well. The encapsulating apparatus 10 further includes means for applying an adhesive, if needed for the bonding operation, the adhesive applying assembly including an applicator roll, not shown, or other technique to provide a film of adhesive along the surfaces being bonded. As indicated in FIG. 1, a pair of finish rolls 23 and 24 are provided in order to complete the encapsulation operation, and these rolls are adapted to provide appropriate pressures and temperatures to accomplish the final encapsulation operation. As previously indicated, and equally applicable to this system, the coverlay film material may be provided with a film of thermally responsive adhesive which may be utilized to form the bond between the coverlay material and the mounted printed wiring.

Turning now to the design of the tack bonding or tack rolls 15 and 16, it will be observed that the member 15 has a reticulate pattern provided in raised configuration along the surface of the roller. This configuration will, of course, provide a corresponding bonded area of like configuration in the finished product, such as is illustrated in detail in FIG. 2. The individual protrusions which extend outwardly from the circumference of the roller 15, such as is illustrated in exaggerated form at 27, extend or protrude for a distance of about 30 to 60 mils for treatment of a laminate consisting of two films of 3 mil Mylar and one film or layer of 2 ounce copper. As is conventional, the roller 15 is arranged in overlying relationship to the roll 16, with the nip formed between the rolls being arranged to receive the individual sheets of the laminate material, these sheets including the circuitry-substrate combination from the supply roll 18, and the coverlay film from the supply roll 19. It will be observed that these reticulate patterns extend outwardly from the surface of the roller 15 for a distance which is sufficient to prevent entrapment or otherwise encapsulation of air or other gases which may be entrained in the adhesive layer, or which may otherwise be formed in the nip area of the rolls. If desired, the coverlay material may be provided with a film of thermally responsive adhesive which is activated, at least partially, when passed through the nip formed between rollers 15 and 16.

The portion of the area of the individual circuitry covered by the tack-bonded areas is preferably between about 10 percent and about 30 percent of the overall area of the material. Generally, an area of about 30 percent, when arranged in a regular square reticulate pattern has been found to be optimum. It has been learned that when an area greater than about 30 percent is bonded in the tacking operation, a significant amount of shrinkage or anomlous characteristics will appear on the film, and the operation is thereby rendered somewhat less successful. If, on the other hand, less than about 10 percent of the area is covered by the reticulate bonding pattern, it has been found that an inadequate bonding area is established and registration is not held to the extent desired in printed wiring with reasonably close tolerance requirements.

It has been found desirable to form a closed regular pattern which is preferably bonded on four sides, and which encloses, therefore, an incremental zone or area of nonbonded material therewithin leaving vent areas open. This arrangement has been found to enhance the dimensional stability of the materials being brought together and encapsulated, particularly when prepunched coverlay is being considered and treated on a roll-to-roll basis. Tolerances, at least in the machine direction are difficult to maintain. As indicated in FIG. 1, a prepunched hole or bore is formed at 28.

Located downstream from the tack-bonding rollers 15 and 16 are the finish rolls 23 and 24. These rolls are provided to complete the encapsulation operation, and have, as indicated generally, a smooth cylindrical configuration. One of these rolls is normally adapted to be heated in order to provide an appropriate temperature at the nip zone during the final encapsulation operation. Of course, as indicated, the peripheral velocity of these rolls is at least equal to the peripheral velocity of the tack-bonding rolls, in order to eliminate sagging between the stations, to minimize stretching, and to otherwise enhance registration. Preferably, the peripheral speed of the final encapsulation rolls is substantially equal to the peripheral speed of the tack-bonding rolls. Thus, the finished operation may occur, as required, for the final bonding operation.

While it has been indicated that the system is equally adaptable for use with solvent-dispersed adhesives, as well as for solvent-free adhesives, when solvent laden adhesives are utilized, some technique should be provided for the elimination of a substantial portion of the solvent prior to the final encapsulation operation. This operation should, of course, occur prior to the time that the tack-bonding operation is initiated. Thus, entrapment of solvents is substantially avoided.

In order to provide a system for continued enhanced registry, the back-up rolls such as the rolls 16 and 23 are provided with a layer of a material about the periphery, particularly as to 30 and 31 which is modestly compressible. While it is possible to utilize a thin layer of rubber about the periphery of the roll, care should be taken to assure a close match of peripheral velocities to avoid creation of anomalous characteristics or scuffing on the finished product as it moves between the nip areas.

It will be appreciated that various techniques may be utilized to take up the finished product, however as indicated in FIG. 2 of the drawings, a simple take-up roll as at 32 may be utilized for this purpose. Other techniques, as may be indicated in a specific operation, may be utilized as desired.

It will be appreciated that the various specific examples given herein are for purposes of illustration only, and are not to be otherwise construed as a limitation upon the scope of coverage to which this invention is entitled.

I claim:

1. An apparatus for encapsulating mounted printed wiring laminate with at least one flexible coverlay film on a roll-to-roll basis, said apparatus comprising:

(a) means for retaining a supply of mounted printed wiring laminate and a supply of coverlay film;

(b) means for transferring said mounted printed wiring laminate and coverlay film to the nip zone of a first pair of cooperatively arranged roller elements, said first pair of cooperatively arranged roller elements comprising first and second rollers with means being provided for applying pressure to the nip area formed between said rollers, said rollers being characterized in that the outer surface of said first roller has a plurality of substantially continuous, generally radially extending raised narrow rib members extending outwardly in spaced relationship from the surface thereof, said raised ribs being arranged in a reticulate pattern forming isolated integrally arranged substantially closed zones with an axial dimension significantly less than the axial length of said rollers; and (c) a second pair of cooperatively arranged roller elements disposed downstream from said first pair of roller elements, said second pair of roller elements comprising first and second rollers, each having a smooth cylindrical surface, at least one of the rollers of said second pair being provided with heating means for establishing a heated nip zone therebetween.

2. The apparatus as defined in claim 1 being particularly characterized in that the outer surface of the said second roller of said first roller pair is substantially resilient in nature.

3. The apparatus as defined in claim 1 being particularly characterized in that said reticulate pattern is generally square in configuration.

4. The apparatus as defined in claim 1 being particularly characterized in that said reticulate pattern comprises from between about 10 percent and 30 percent of the entire area of said roller.

5. Apparatus for encapsulating mounted printed wiring laminate with at least one flexible coverlay film on a roll-to-roll basis, the apparatus comprising:

(a) means for retaining a supply of mounted printed wiring laminate;

(b) means for retaining a supply of coverlay film spaced from said printed wiring laminate retaining means;

(c) means for delivering said mounted printed wiring laminate and said coverlay film to the nip zone of a first pair of cooperatively arranged roller elements;

(d) said pair of cooperatively arranged roller elements comprising first and second rollers with means being provided for applying pressure to the nip area formed between said rollers, at least one of said rollers being provided with means for heating the surface thereof so as to provide a heated nip zone, the outer surface of one of said rollers having a plurality of substantially continuous, generally radially extending narrow rib members extending outwardly in spaced relationship from the surface thereof, said ribs being arranged in a reticulate pattern forming integrally arranged substantially closed zones of a dimension significantly less than the axial length of said rollers; and (e) a second pair of cooperatively arranged roller elements disposed downstream from said first pair of roller elements, said second pair of roller elements comprising first and second rollers, each having a smooth cylindrical surface, at least one of the rollers of said second pair being provided with heating means for establishing a heated nip zone therebetween.

References Cited

UNITED STATES PATENTS

| | | | |
|---|---|---|---|
| 2,584,002 | 1/1952 | Elser et al. | 156—553X |
| 3,268,846 | 8/1966 | Morey | 156—383X |
| 3,441,463 | 4/1969 | Buck | 156—324X |

BENJAMIN A. BORCHELT, Primary Examiner

S. C. BENTLEY, Assistant Examiner

U.S. Cl. X.R.

174—68.5